(12) United States Patent
Boland et al.

(10) Patent No.: US 7,239,996 B2
(45) Date of Patent: Jul. 3, 2007

(54) CAUSALITY BASED EVENT DRIVEN TIMING ANALYSIS ENGINE

(76) Inventors: Arthur J. Boland, 25736 SE. 25th Way, Sammamish, WA (US) 98075; Richard M. Pier, 27905 SW. Ladd Hill Rd., Sherwood, OR (US) 97140; William Matthew Hogan, 432 Livingwood La., Lake Oswego, OR (US) 97034

( * ) Notice: Subject to any disclaimer, the term of this patent is extended or adjusted under 35 U.S.C. 154(b) by 613 days.

(21) Appl. No.: 10/447,762

(22) Filed: May 28, 2003

(65) Prior Publication Data

US 2003/0229483 A1 Dec. 11, 2003

Related U.S. Application Data

(60) Provisional application No. 60/388,024, filed on Jun. 10, 2002, provisional application No. 60/414,377, filed on Sep. 27, 2002.

(51) Int. Cl.
G06F 17/50 (2006.01)

(52) U.S. Cl. .......................................... 703/19; 702/79

(58) Field of Classification Search ................ 703/19, 703/14; 702/79; 716/6
See application file for complete search history.

(56) References Cited

U.S. PATENT DOCUMENTS

| 4,763,289 A | 8/1988 | Barzilai et al. |
| 5,218,551 A | 6/1993 | Agrawal et al. |
| 5,365,463 A | 11/1994 | Donath et al. |
| 5,404,360 A | 4/1995 | Suzuki et al. |
| 5,740,347 A | 4/1998 | Avidan |
| 5,761,097 A * | 6/1998 | Palermo .................... 702/79 |
| 5,790,435 A * | 8/1998 | Lewis et al. .................. 716/6 |
| 5,790,830 A | 8/1998 | Segal |
| 5,864,487 A | 1/1999 | Merryman et al. |
| 5,894,419 A | 4/1999 | Galambos et al. |
| 6,158,022 A | 12/2000 | Avidan |
| 6,185,723 B1 | 2/2001 | Burks et al. |
| 6,401,231 B1 | 6/2002 | Belkhale et al. |
| 6,438,731 B1 | 8/2002 | Segal |
| 6,442,739 B1 | 8/2002 | Palermo et al. |
| 6,496,972 B1 | 12/2002 | Segal |
| 6,604,227 B1 | 8/2003 | Foltin et al. |
| 6,611,948 B1 | 8/2003 | Tyler et al. |
| 6,618,856 B2 * | 9/2003 | Coburn et al. ............. 717/135 |

(Continued)

OTHER PUBLICATIONS

Ajay Janami Daga, "The Accurate and Efficient Timing Verification of Interacting Finite State Machines", *Dissertation, Computer Science and Engineering Department*, University of Michigan, pp. 1-157, 1995.

(Continued)

*Primary Examiner*—Albert W. Paladini
(74) *Attorney, Agent, or Firm*—Klarquist Sparkman, LLP

(57) ABSTRACT

Printed circuit board, ASIC, transistor group, or other circuit timing can be analyzed by symbolically modeling the circuit, simulating the behavior of the circuit, analyzing the behavior to catch timing violations. Routing constraints for critical traces can be made by using the analysis results as the input to a trace circuit router. Further timing verification of the printed circuit board, ASIC, transistor group, or other circuit layout may be accomplished by analyzing and modeling the interconnect delays of the traces, simulating the symbolic circuit model with the interconnect delay model, and analyzing the behavior of the circuit for timing violations.

31 Claims, 14 Drawing Sheets

U.S. PATENT DOCUMENTS

| | | | |
|---|---|---|---|
| 6,678,644 | B1 | 1/2004 | Segal |
| 6,687,501 | B2* | 2/2004 | Soliman .................... 455/424 |
| 6,806,830 | B2* | 10/2004 | Panasik et al. ............ 342/464 |
| 7,062,734 | B2 | 6/2006 | Collins, Jr. |

OTHER PUBLICATIONS

Daga et al., "Interface Finite-State Machines: Definition, Minimization, and Decomposition", *IEEE Transactions on Computer Aided Design of Integrated Circuits and Systems*, vol. 16, No. 5, pp. 497-505, May 1997.

Daga et al., "A Symbolic-Simulation Approach to the Timing Verification of Interacting FSMs", *IEEE*, pp. 584-589, 1995.

Boussebha et al., "Temporal Verification of Behavioral Descriptions in VHDL," *Design Automation Conference*, 1992, pp. 692-697.

Baquero et al., "Causality in Autonomous Mobile Systems," *Third European Research Seminar on Advances in Distributed Systems*, 1999, 8 pages.

IBM® website, www.http://houns54.clearlake.ibm.com, "*EinsTimer: Timing Analysis*," 2003, 2 pages.

\* cited by examiner

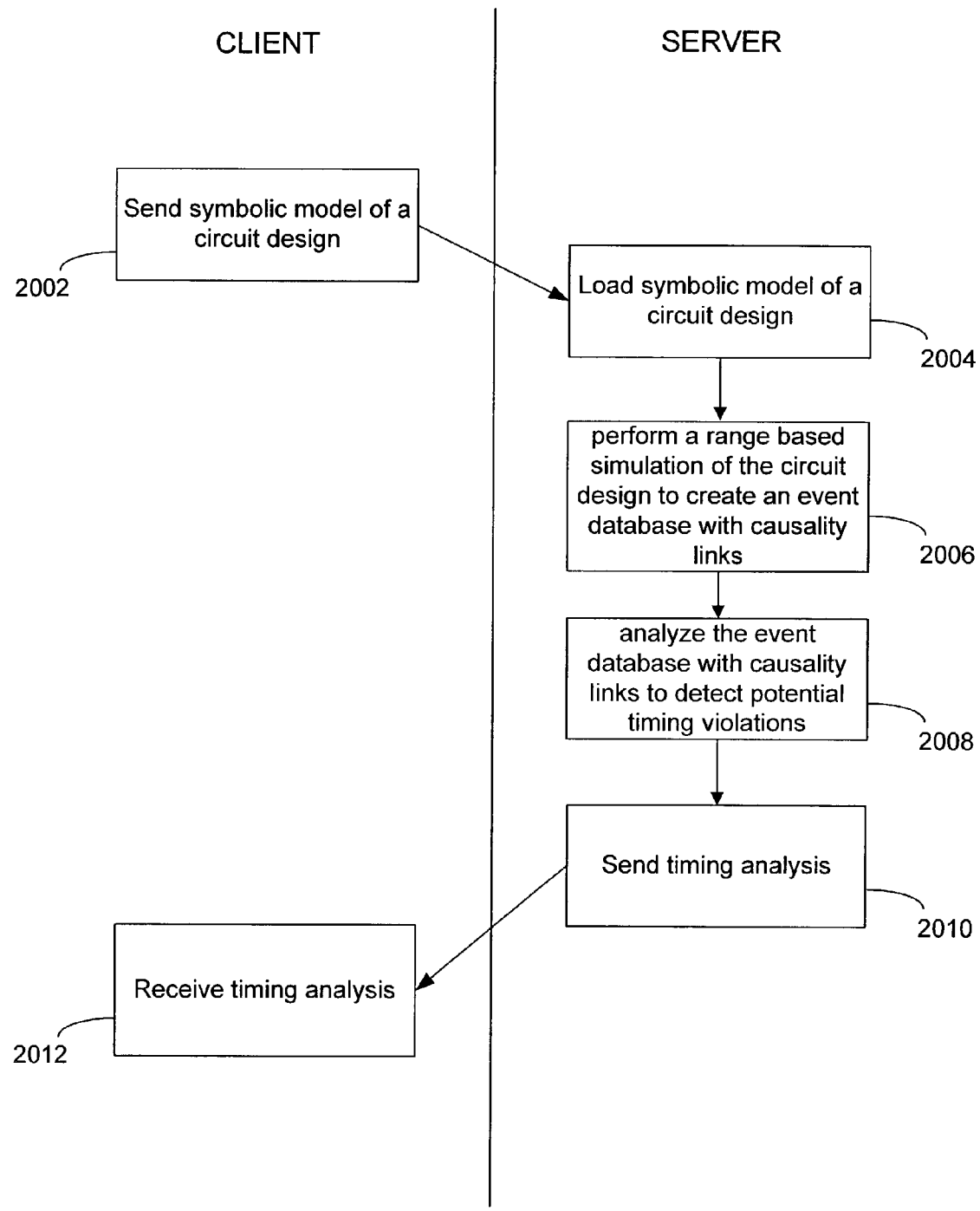

CAUSALITY BASED EVENT DRIVEN TIMING ANALYSIS ENGINE

CROSS REFERENCE TO RELATED APPLICATIONS

This patent application claims priority to U.S. Provisional Patent Application No. 60/388,024, filed on Jun. 10, 2002, and entitled "CAUSALITY BASED EVENT DRIVEN TIMING ANALYSIS ENGINE", and U.S. Provisional Patent Application No. 60/414,377, filed on Sep. 27, 2002, and entitled "CAUSALITY BASED EVENT DRIVEN TIMING ANALYSIS ENGINE", which are incorporated herein by reference.

FIELD

The disclosure generally relates to timing analysis of a circuit design, and more particularly to a dynamic timing analysis engine.

BACKGROUND

As clock speeds in circuits continue to increase, circuit board design is becoming increasingly difficult. Ever increasing clock speeds result in ever decreasing slack times which handcuff the designer and limit the flexibility of the design. To compensate, circuit designers use timing analysis tools to reduce development times for circuits with tight timing requirements.

For example, many designers use static timing analysis tools to verify a circuit design. Static timing analysis tools track critical paths through gate level circuitry, typically without regard to the functionality of the circuitry involved. This leads to the traversal and reporting of false critical paths. As a result, the designer who uses static timing analysis tools has to wade through thick timing violation reports only to discover that many of the supposed violations would have never occurred but for the logical operation of the components in a circuit board design. Timing violations, for example, do not occur downstream from a disabled chip. The logical operation of the components in the circuit often interact in a master/slave (controller/controlled) relationship. To investigate all of the supposed violations would require a great deal of time on the part of the engineer. Ignoring potential violations, however, exposes oneself to faulty circuit design. Static timing analysis tools, by their gate level analysis nature, do not handle complex bus functional component-component interactions very well. It is widely known that static timing analysis tools exhibit significant drawbacks when used to analyze the timing of printed circuit boards.

FIGS. 1–3 illustrate a problem with some static analysis tools, which are synchronous. FIG. 1 shows an example of a circuit with two master M1, M2 and two slave S1, S2 components. The output of a master component directly controls the activity of one or more slave components on the bus. A component may be a slave, but behave as a master to other slave components further downstream. A microprocessor, for example, may control a memory controller, which in turn may control one or more banks of memory.

FIG. 2 shows the circuit of FIG. 1 with master M1 and slave S2 active. FIG. 3 shows the circuit of FIG. 1 with master M2 and slave S1 active. For the circuit in FIG. 2, a static timing analysis tool may treat slave S1 as unused circuitry and eliminate it from further analysis. If the state of the circuit then changes to that of FIG. 3, the static timing analysis tool may, having already eliminated slave S1, erroneously treat slave S2 as slave S1.

To overcome problems inherent with static timing analysis tools, some designers have switched to using dynamic timing analysis tools, which consider component operation. Dynamic timing analysis tools generally use a bus functional circuit model. Bus functional means that a component in the circuit is considered at a defined boundary which interacts with other portions of the circuit. The behavior at this boundary is characterized (often as a finite state machine (FSM) with well-defined behavior) to describe the logical operation of the device without exposing un-necessary complexities contained within the internal structure of the component. The internal construction of the integrated circuit is irrelevant, so long as the input/output behavior is well known.

The example problem with static analysis tools given above does not affect dynamic timing analysis tools, because the bus functional circuit model is designed to preserve the integrity of the circuit model. For example, for the circuit in FIG. 2, a dynamic timing analysis tool would simply not make any changes to the slave S1 FSM as long as slave S1 remains inactive. If the state of the circuit then changes to that of FIG. 3, the dynamic timing analysis tool would actively monitor state changes for slave S1, while the slave S2 FSM would stop changing states.

FIG. 4 shows an example of a FSM, in this case representing RAM. The three possible states are IDLE 402, WRITE 404, and READ 406. The RAM state machine changes depending on several inputs including: output enable (OE), chip select (CS), and write enable (WE). For example, when in IDLE 402, the exemplary state machine remains in IDLE 402 as long as CS is high, regardless of OE and WE. The FSM switches from IDLE 402 to READ 406 if WE is high and both CS and OE are low. The FSM switches from IDLE to WRITE if OE is high and both CS and WE are low.

Propagation delays through the RAM may depend on the current state and the next state. For example, it is possible that a transition from the READ 406 state to the WRITE 404 state may take longer than the reverse. The complete behavioral model of a FSM is known as a symbolic model. Symbolic models for use in dynamic timing analysis may be supplied by electronics manufacturers or they may be created by an engineer with a copy of the electronic data sheet for a given integrated circuit. In dynamic timing analysis, also known as symbolic timing analysis, the analysis changes dynamically as simulated behavior of the circuit changes.

Even though dynamic timing analysis tools are far superior to static timing analysis tools, they also suffer from drawbacks. For example, current dynamic timing analysis tools are understood to idealize the behavior of clock signals by using nominal values for propagations delays, which are listed on electronic data sheets.

FIG. 5 shows a circuit with a clock signal that diverges along two paths. Clock 1 terminates a first integrated circuit IC1. Clock 2 propagates through some logic 502 before terminating at a second integrated circuit IC2.

FIG. 6 shows the phase shift 602 in the arrival times of clocks 1 and 2. Clock 2 arrives at IC2 after clock one arrives at IC1, because of the propagation delays of the clock 2 signal that passes through the logic 502. Simulating clock signal propagation with only phase shifts reduces simulation complexity, but can lead to simulation errors due to the oversimplification of clock signal behavior.

Prior art fully functional simulators are understood to idealize clock signals by adding a single value arrival time offset, or phase shift, to a clock signal arrival time at nodes that the clock signal propagates through. Prior art static timing analyzers may return overly pessimistic results, because they are understood to be unable to identify the relational interactions between components either in a clock tree or in the circuit as a whole. Prior art dynamic analysis tools are understood to produce erroneous results in many cases, because the clock tree is reduced to a matrix of phase shift and variance (skew) terms between clock points in the circuit, specifically between "Master" clock points (e.g. drivers) and "Slave" clock points (e.g. receivers). Where the clock points include a portion of the clock tree in common, the phase shift and skew terms are sometimes computed incorrectly by prior art dynamic analysis tools by essentially "double-counting" the delay of the common section. Another problem with current dynamic timing analysis tools as they are understood is in the way they simulate and analyze the circuit.

FIG. 7 shows how current dynamic timing analysis tools are understood to alternate between simulation and analysis. Current dynamic timing analysis tools simulate one clock cycle of circuit behavior and then analyze the simulated circuit behavior for timing violations for that clock cycle. Once the analysis is complete, the simulator picks up where it left off and simulates another clock cycle of circuit behavior, followed by more analysis. The cycle by cycle alternation of the simulator and analyzer continues until the desired timing analysis window has been covered. If the designer wants a simulation/analysis of 20 clock cycles, the prior art dynamic timing analysis tool alternates between the simulator and analyzer 20 times. Unfortunately, this cycle by cycle technique may not verify the timing constraints of some signals, particularly when feedback paths are involved, which may cause some timing errors to be overlooked.

A designer may also choose to use a fully functional simulator, such as ModelSim® simulator software from Mentor Graphics of Willsonville, Oreg., to verify circuit timing. Fully functional simulators commonly use discrete time, simulate circuit behavior at the gate level, and are most commonly used for integrated circuit functionality verification. These simulators typically simulate behavior for thousands or even hundreds of thousands of clock cycles per instance at a large computing cost. In addition, they typically discard timing event information during the simulation, which may be millions of data points per clock cycle. Commonly, only enough data is saved to record functional behavior and for waveform generation to present to the designer. Furthermore, fully functional simulators typically assume that signals arrive at discrete times, because of the massive amount of data generated during analysis. Fully functional simulators also typically require a great deal of interaction from the designer to set up the initial conditions of the simulation.

Fully functional simulators are intended to verify functionality of circuits, and, accordingly, are understood to not generally save complete event data once the event has been simulated and analyzed. The events in functional simulators also do not generally include causality links, nor are they understood to store signal arrival time windows as a range-based simulator does.

Overall, current timing analysis tools suffer from deficiencies when used for bus functional circuit timing analysis, particularly when used for complete system timing verification and generation of routing constraints. Thus, there is a need for an improved timing analysis tool.

SUMMARY

A dynamic timing analysis tool and method is disclosed that uses a range-based simulation and analysis of a circuit design using causality links. Additionally, in accordance with one aspect, the tool desirably treats clock paths as general circuit paths to increase timing analysis accuracy. The tool also desirably simulates circuit behavior to create a database of events with causality links before analyzing the database to detect timing violations.

These features and others of the described embodiments will be more readily apparent from the following detailed description which proceeds with reference to the accompanying drawings. The present invention is directed toward new and un-obvious features and method acts set forth herein both alone and in various combinations and subcombinations with one another. The invention is not limited to the embodiments disclosed herein or to embodiments which solve any one or more specific problems of the known art.

BRIEF DESCRIPTION OF THE DRAWINGS

FIG. 20 is a flow chart of an example method for performing exemplary dynamic timing analysis tool over a network.

DETAILED DESCRIPTION

Introduction

Figure 1:
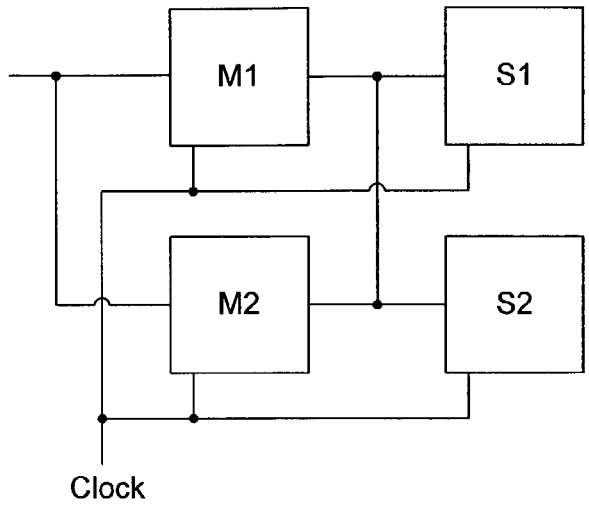
FIG. 1 shows a prior art example of a circuit with master and slave components to illustrate a simplified example of how a static timing analysis works.
Figure 2:
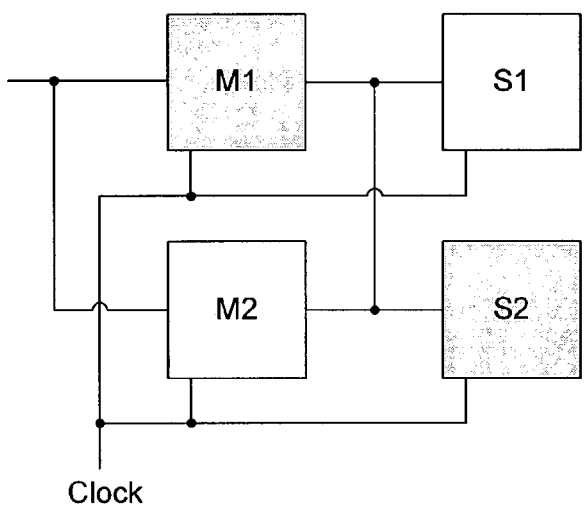
FIG. 2 shows the prior art circuit of FIG. 1 with master M1 and slave S2 active to illustrate how a static timing analysis works.
Figure 3:
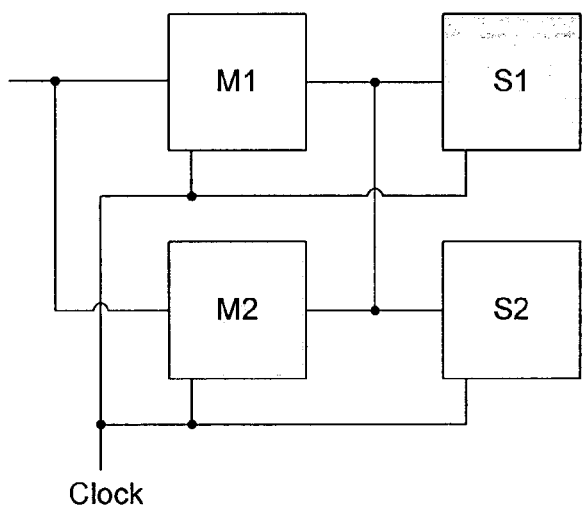
FIG. 3 shows the prior art circuit of FIG. 1 with master M2 and slave S1 active to illustrate how a static timing analysis works.
Figure 4:
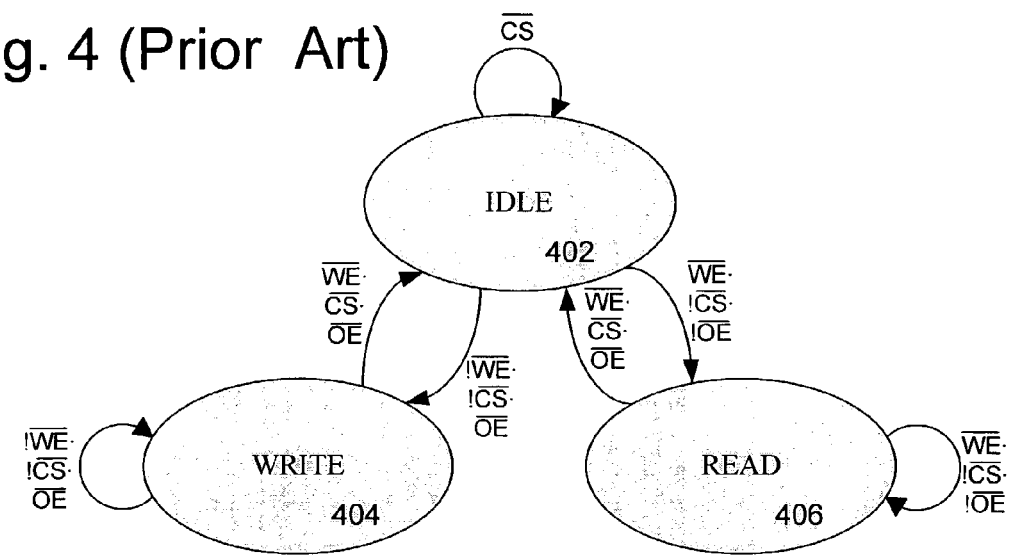
FIG. 4 is a simplified prior art example of a finite state machine used by a dynamic timing analysis tool.

A dynamic timing analysis tool is described that, in a desirable embodiment, uses range-based simulation techniques and causality links. The range-based simulation techniques can include keeping track of an arrival time window for each signal at each point of interest. The arrival time window desirably represents all possible arrival times for a given signal, from the earliest to the latest. As a signal propagates through the circuit, the arrival time window grows, because any propagation delay uncertainty is cumulative for the signal. By keeping track of arrival time windows, the simulator part of the dynamic timing analysis tool more accurately simulates circuit behavior. In addition to using range-based simulation techniques, the dynamic timing analysis tool desirably also keeps track of causality links.

A causality link associates a change of state, or event, for a given bus functional description, often described with a finite state machine (FSM), to the event or events that triggered it. A designer may use causality links to more easily track a source of a timing violation. Additionally, with the help of causality links a designer can track two signals that have a common ancestor trigger and have a critical arrival time offset between them.

The dynamic timing analysis tool differs significantly from prior timing analysis tools. Where a fully functional behavior analyzer simulates for hundreds of thousands of clock cycles, one embodiment of the described dynamic timing analysis tool desirably simulates between 2 and about 1000 clock cycles. Another embodiment more desirably simulates between 2 and about 100 clock cycles. In yet another embodiment, the described dynamic timing analysis tool even more desirably simulates typically about 10 clock cycles. This is because the emphasis for the fully functional simulator is on the behavior of a circuit, rather than timing, and it may require a large number of clock cycles (100,000 or even 1,000,000 clock cycles are common) to expose all of the behaviors associated with the circuit logic. Conversely, it usually takes only a few clock cycles to expose the timing relationships of the signals in the circuit. The described dynamic timing analysis tool desirably requires a minimal amount of internal integrated circuit information to summarize integrated circuit behavior as a symbolic model, which may model an integrated circuit, ASIC functional block input/output behavior, or a group of transistors with a bus functional description. Symbolically modeling a circuit comprises replacing pieces of complex logic, such as integrated circuits, functional blocks in an ASIC, or a group of transistors, with bus functional descriptions such that signals on the bus, and not necessarily inside the complex logic, are desirably simulated and analyzed to verify the timing integrity of the circuit. The bus functional description used for timing analysis does not need to precisely model the actual complex behavior of the component, but desirably contains sufficient precision to expose all relevant timing characteristics.

System

Figure 8:
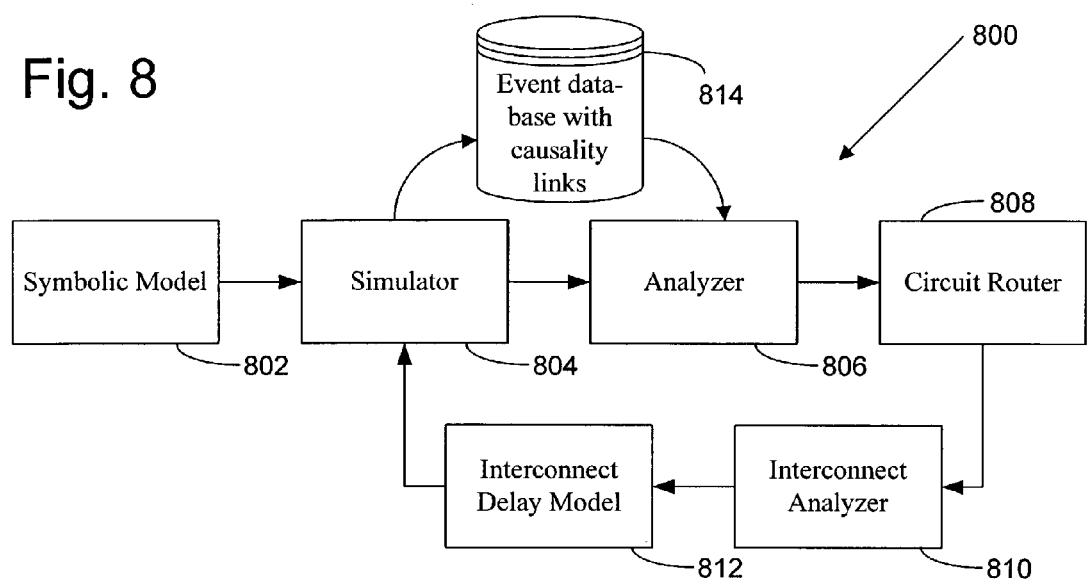
FIG. 8 shows an example of functional components of an embodiment of dynamic timing analysis tool according to the present invention.

FIG. 8 schematically illustrates one embodiment of a dynamic timing analysis tool 800. The illustrated tool 800 comprises the simulator 804 and analyzer 806 used to detect timing problems in a circuit design which is illustrated as a symbolic model 802. A symbolic model 802 of a circuit design is desirably a logical representation of a circuit design wherein functionality of most, if not all, integrated circuits in the circuit design are reduced to corresponding symbolic models. The symbolic models representing each integrated circuit mimics input and output behavior of the corresponding integrated circuit, but does not necessarily simulate the internal logic of the corresponding circuit. A bus functional description in the symbolic model 802 desirably contains the minimal amount of logic necessary to emulate the timing characteristics of a corresponding circuit on the bus. The symbolic model is desirably a bus functional model, meaning that signal behavior is not necessarily simulated inside of integrated circuits. Instead, signal behavior is desirably simulated in the circuit design up to the input pins and out of the output pins of an integrated circuit in the symbolic model 802. The symbolic model representing an integrated circuit simulates the response of the integrated circuit to external stimulus and controls the output pins of the integrated circuit in response to the stimulus. Using a symbolic model 802 greatly reduces the amount of data that must be simulated and analyzed. For example, if a symbolic model does not change state, the output of the symbolic model is constant. In another example, if a symbolic model is in an idle state, meaning that the incoming chip select signal does not assert that the chip is active, the output of the symbolic model is considered to be meaningless and desirably will not be simulated or analyzed. Not simulating or analyzing meaningless signals reduces both the processor time and memory resources required for the timing analysis.

The simulator 804 simulates the functional behavior of the circuit and records changes of state in symbolic models, known as events, in the event database 814 with causality links. An exemplary data structure for an event (discussed below) includes an arrival time window for the signal that triggered the state change. By recording an arrival time window, or range, desirably with each event, the simulator is said to be range-based. The causality links (discussed below) that are recorded with events in the event database 814 desirably include links that track events that trigger other events to occur. The simulator 804 records the causality of events along with the event data. Unlike prior art simulations, the range-based simulation runs, uninterrupted, for a plurality of clock cycles, desirably from 2 to about 1000. The simulation can run for more clock cycles in a given simulation. A desirable range of consecutive clock cycles which are run prior to interruption (e.g. for analysis of the results) is from 2 to 100 and a particularly desirable number of clock cycles is from 2 to 10. The number of clock cycles is desirably chosen to expose timing behaviors.

After the simulation has run for a sufficient number of clock cycles to expose the relevant timing, the analyzer 806 analyzes the event database 814, which was created by the simulator 804, to verify timing constraints and identify timing violations. The causality links stored in the event database 814 are used by the analyzer to determine when a signal is supposed to arrive at a given point and to compare it to when the signal actually arrives. Causality links can also be used by the designer to track the arrival time difference between two correlated signals as the signals propagate through the circuit.

When the analyzer 806 analyzes the event database 814, the analyzer 806 desirably calculates a range of slack times for each signal that triggers an event. A slack time is the difference in time between when a signal arrives at a point (arrival time) and when the signal is required to arrive at the point (required time) to satisfy the timing requirements of the circuit. For example, if a signal arrives at a point at time t1=3 ns and the required time is time t2=5 ns, then the slack time is t2−t1=5 ns−3 ns=2 ns. A negative slack time means that the signal arrives after the required time. Because each signal has an arrival time range and the range is compared to a specific required time, a range of slack times can be computed for a signal that triggers at least one event. Designers use the slack time information, among other things, to figure out what parts of a circuit have very tight timing requirements and which parts have more leeway. This allows the designer to modify the circuit design in such a way, such as adding more circuitry in areas with larger slack times or removing circuitry in areas with smaller slack times, to more effectively modify the circuit design to meet timing requirements.

The designer can iteratively modify the circuit design and symbolic model 802 and run the simulator 804 and analyzer 806 until no timing violations are detected. The designer then has the option to use the output of the analyzer 806 as an input into a circuit router 808. A circuit router 808 creates a physical layout of the circuit design including locations of integrated circuits (and other logic) and plots trace paths that connect all of the components of the circuit design. If the designer so desires, the analyzer can specify, in order of priority, which traces have minimum and maximum trace length requirements in order for the timing requirements of the circuit to be met. The circuit router 808 then plots the traces with critical timing requirements first. Plotting critical traces first drastically reduces the likelihood that the circuit router 808 produces a circuit layout that breaks the timing of the circuit.

After the circuit router 808 has plotted the traces of the circuit design, the designer has the option of verifying the timing of the physical layout of the circuit design. The physical layout of the circuit design represents the physical measurements of the circuit traces as they would exist if the circuit were to be manufactured. The interconnect analyzer 810 analyzes the physical layout of the circuit design, along with the material properties of the circuit traces, to calculate analog effects such as overshoot, undershoot, and line noise to create an interconnect delay model 812, which is a model of the analog effects of the physical circuit layout. The interconnect delay model 812 comprises a time delay or advance for each trace in the circuit. The interconnect delay model 812 is fed into the simulator 804 along with the original symbolic model 802 of the circuit design. The simulator 804 simulates the circuit behavior and creates a second event database 814 with causality links using the symbolic models 802 and the interconnect delay model 812. The analyzer 806 can then analyze the second event database 814 with causality links for timing violations. Thus, the physical layout of the circuit design can be taken into consideration when determining whether or not the timing of the circuit design is valid.

Figure 9:
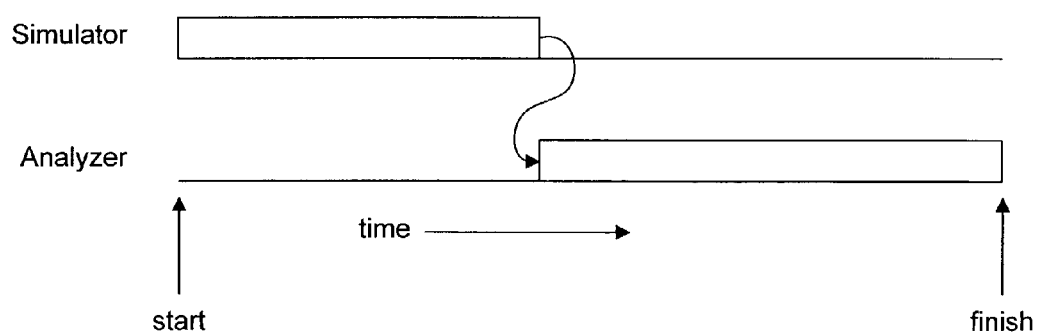
FIG. 9 shows an example of a serial progression of the simulator and analyzer for the dynamic timing analysis tool of FIG. 8.

FIG. 9 shows the serial run time nature of the simulator 804 and analyzer 806 for the described dynamic timing analysis tool. In one embodiment, the described dynamic timing analysis tool runs the simulator for a plurality of clock cycles and then, desirably after the simulation is complete, runs the analyzer to look for timing violations. Running the simulator for a plurality of clock cycles before analyzing the results more effectively exposes timing behavior problems. By simulating circuit behavior for more than one clock cycle at a time, timing constraints for signals whose behavior traverses multiple clock cycles are more properly accounted for. For example, a memory device that switches from a read state to a write state may wait two clock cycles before it starts to capture data. In order to fully expose timing violations with respect to the memory, an entire simulation is desirably performed for a number of clock cycles that will expose any likely timing violations of the memory before any analysis is performed.

Figure 10:
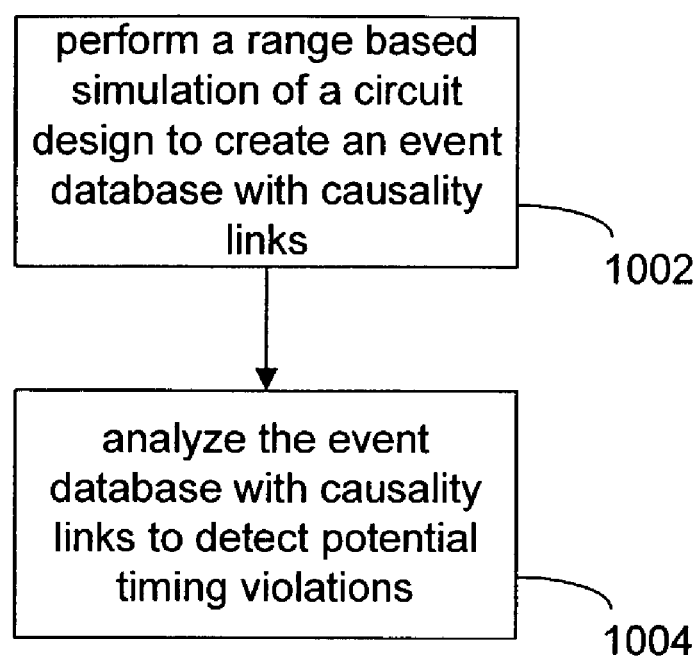
FIG. 10 is a flow chart of an exemplary method for simulating and analyzing a circuit using a dynamic timing analysis tool.

FIG. 10 shows a flow chart of the method illustrated in FIG. 9. At 1002 a range based simulation of a circuit design is performed to create an event database with causality links. Each time a FSM in the dynamic model of the circuit design changes state, corresponding event data structures are desirably added to the event database 814. Causality links between the added event and prior events are desirably established and added to the event database. The range-based techniques refer to the practice of keeping track of an arrival time window for a given signal as the signal propagates through the circuit. Arrival time windows assist the analyzer in testing possible signal arrival time combinations in order to find timing violations. At 1004 the event database with causality links is analyzed to detect potential timing violations. The analyzer checks possible combinations of signal arrival times from arrival time windows when two or more signals are required for a state change to occur for a FSM. Causality links are used to determine when a given signal is supposed to arrive at a given point so that the actual arrival time window can be compared to when the signal is supposed to arrive. Causality links can also be used to analyze the arrival time difference between two signals as they propagate through the circuit. The analyzer 806 examines the event database 814, works in reverse, and verifies that events that cause other events have valid logic states. Causality links are especially helpful for exposing timing violations for signals whose cause and effect span multiple clock cycles.

Figure 11A:
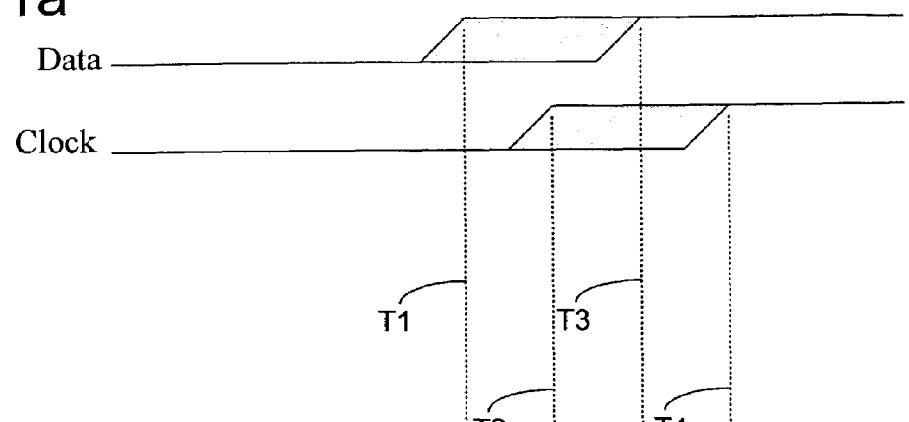
FIG. 11a shows an example of the range-based nature of signal arrival times.

FIG. 11*a* is an example of two signals with arrival time windows. The data signal arrives between time T1 and time T3, while the clock signal arrives between time T2 and time T4. In this example, it is desired that the data signal arrive before the clock signal, as would be the case for a flip-flop. However, it is possible that the clock signal arrives at T3 prior to the data signal, which may be valid at T2, as described further below. It is apparent that the data signal generally arrives before the clock signal in FIG. 11*a*. Although prior arrival of the data signal is not required, it is desired to simulate the extreme timing cases.

Figure 11B:
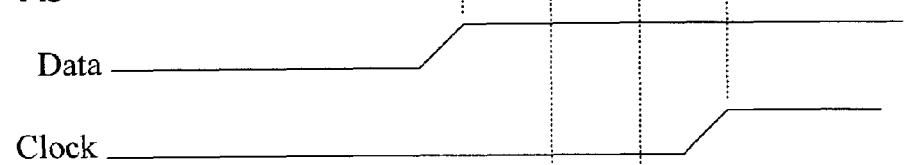
FIG. 11b shows an exemplary valid signal timing combination.

FIG. 11*b* shows one timing extreme with the earliest possible data signal arriving at time T1 paired with the latest possible clock signal arriving at time T4. The earliest arrival time of the data signal and the latest arrival time of the clock signal are used as a first set of signals to be tested for timing violations. In this case, the data signal arrives before the clock signal, so the timing requirements for a flip flop or other component requiring data to arrive simultaneously or before the clock signal are met. Now the other timing extreme needs to be examined.

Figure 11C:
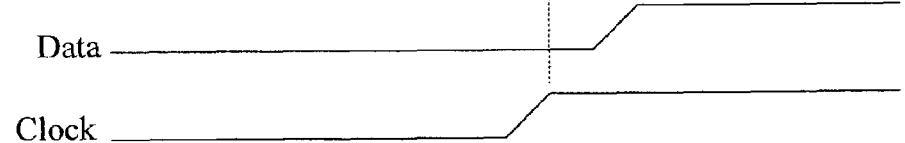
FIG. 11c shows an exemplary invalid signal timing combination.

FIG. 11c shows the latest possible data signal arriving at time T3 paired with the earliest possible clock signal arriving at time T2. The latest arrival time of the data signal and the earliest arrival time of the clock signal are used as a second set of signals to be tested for timing violations. In this case the clock signal arrives before the data signal, and, therefore, for a flip flop, there is a timing violation. By examining the timing implications of the extremes of signal arrival time windows, a more accurate timing analysis can be accomplished. Using the extremes of the possible timing combinations ensures that the worst case combination will be tested for timing violations.

By contrast, known prior art dynamic timing analysis tools are understood to treat the timing in FIG. 11b as a setup constraint and the timing of FIG. 11c as a hold constraint. It is possible that, under these classifications, neither condition is a timing violation and thus goes unreported as an error, even though some permutation of timings between these two extremes might be a setup constraint violation, a hold constraint violation, or both.

The described dynamic timing analysis tool recognizes that the extreme conditions shown in FIG. 11b and FIG. 11c, as well as the continuous spectrum of conditions between these two extremes, are all part of the same constraint situation that allows the analyzer to recognize more timing errors than the prior art. The technique is called range-based, because the signal arrival time window, or range, is the foundation of the technique. Thus, by using range-based simulation techniques to test possible timing combinations for timing violations, the dynamic timing analysis tools produces a more accurate timing analysis than analysis tools that do not use the technique.

Figure 11D:
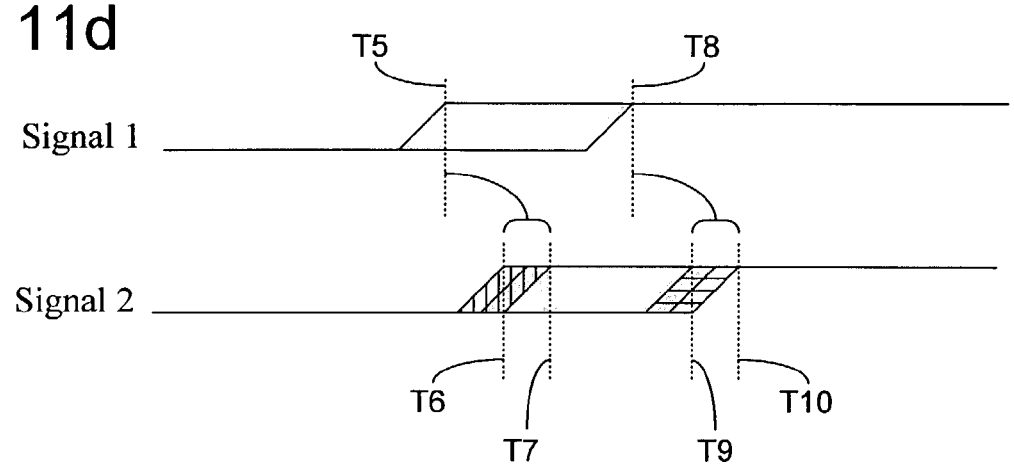
FIG. 11d shows an exemplary correlated signal combination.

FIG. 11d shows an exemplary correlated signal combination. Correlated signals are generally known to have arrival time relationships with respect to each other, either in absolute time or percentage of time. For example, Signal 1 has an earliest arrival time of T5 and a latest arrival time of T8. Signal 2, which is correlated to Signal 1, arrives a certain amount of time (which is the phase shift) after Signal 1 plus or minus a skew time, or variance. In this case, to meet the correlation requirements, if Signal 1 arrives at time T5, signal 2 should arrive sometime between time T6 and time T7. Likewise, if Signal 1 arrives at time T8, signal 2 should arrive sometime between time T9 and time T10.

In order to determine whether or not the timing requirements of a circuit are met for correlated signals, the dynamic timing analysis tool desirably tests the extreme timing possibilities of the correlated signals. The earliest time of a first signal is matched with the latest correlated arrival time of a second signal for timing analysis. Likewise, the latest time of the first signal is matched with the earliest correlated arrival time of a second signal for timing analysis. In the example of FIG. 11d, Signal 1 arriving at time T5 and Signal 2 arriving at time T7 are a first set of signals to be matched and tested for timing violations. Also, Signal 1 arriving at time T8 and Signal 2 arriving at time T9 are a second set of signals to be matched and tested for timing violations. It should be noted that any signal may be correlated with any other signal and that any signal may have more than one signal correlation.

Figure 12:
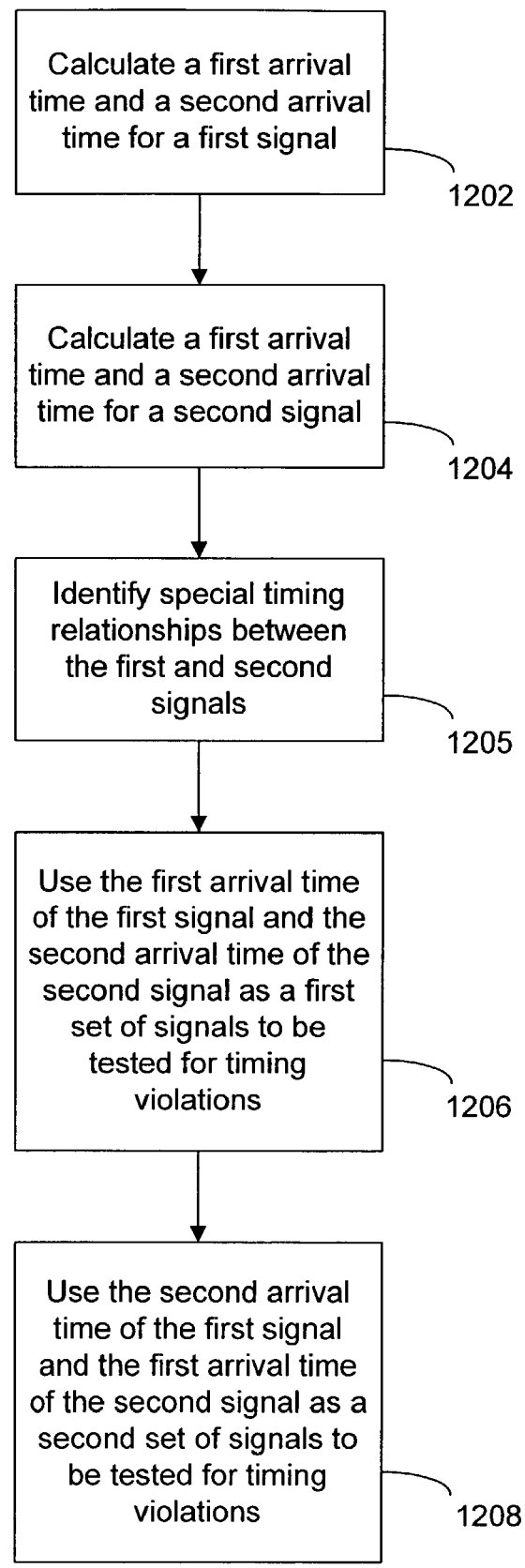
FIG. 12 is a flow chart of an embodiment of a method for range-based simulation using a dynamic timing analysis tool.

FIG. 12 shows a flow chart of an exemplary range-based technique. In process block 1202 a first arrival time and a second arrival time for a first signal are calculated. In process block 1204 a first arrival time and a second arrival time for a second signal are calculated. In process block 1205, special timing relationships between the first and second signals are identified. These timing relationships, such as a signal correlation, are identified in order to establish what constitutes the first and second arrival times for the two signals. In process block 1206 the first arrival time of the first signal and the second arrival time of the second signal are used as a first set of signals to be tested for timing violations. In process block 1208 the second arrival time of the first signal and the first arrival time of the second signal are used as a second set of signals to be tested for timing violations. It should be obvious that the ordering of the first two steps is irrelevant. Likewise, the ordering of the last two steps is also irrelevant.

If the two signals are not correlated, the first and second arrival times for a given signal desirably comprise the earliest and latest arrival times respectively, as discussed above and shown in FIGS. 11a–11c. If the two signals are correlated, the first and second arrival times for the first signal desirably comprise the earliest and latest arrival times respectively.

The second arrival time of the second signal desirably comprises the latest arrival time of the arrival time window correlated to the first arrival time of the first signal. Likewise, for correlated signals, the first arrival time of the second signal desirably comprises the earliest arrival time of the arrival time window correlated to the second arrival time of the first signal. The desirable pairing of arrival times for timing analysis for correlated signals is discussed above with reference to FIG. 11d.

In the event that multiple signals are required to initiate a transition from one state to another, the relevant signals are evaluated to determine the resulting state transition. A state transition is desirably initiated when a non-ambiguous combination of logic values for the relevant signals is encountered. Methods for analyzing non-ambiguous combinations of logic values, such as use of a logic table, are well known in the art.

The described range-based simulation technique lends itself to treating clock paths as general circuit paths. By treating clock paths as general circuit paths, the circuit behavior simulation accuracy is greatly improved.

Figure 5:
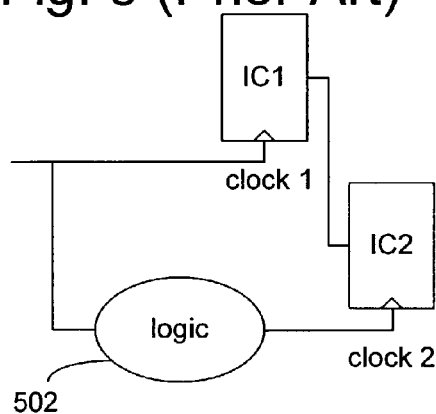
FIG. 5 is a circuit with two diverging clock paths illustrating a simplified example of how prior art dynamic timing analysis tools work.
Figure 6:
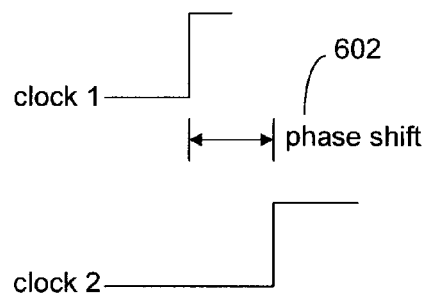
FIG. 6 shows the phase shift of the clock paths from FIG. 5 illustrating how prior art dynamic timing analysis tools work.
Figure 7:
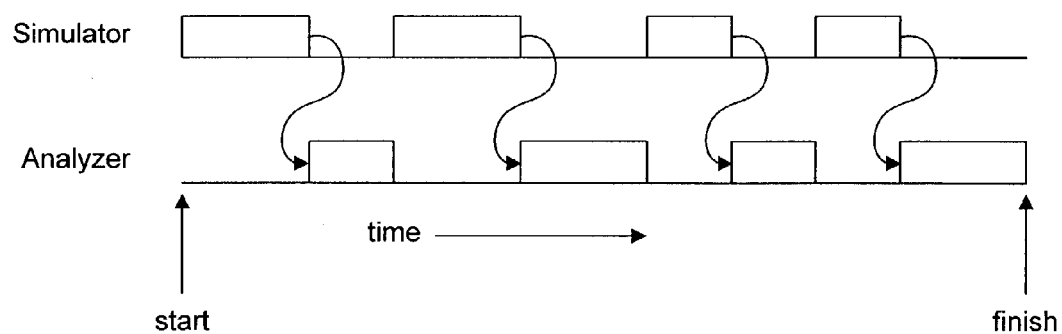
FIG. 7 shows the back and forth nature of the simulator and analyzer of certain prior art dynamic timing analysis tools.
Figure 13:
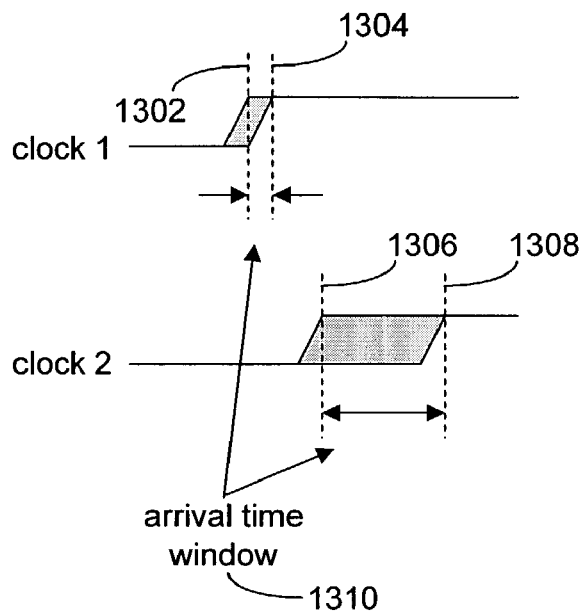
FIG. 13 is a timing diagram showing an exemplary clock arrival time windows when clock paths are treated as general circuit paths.

FIG. 13 shows an example of the results of treating clock paths as general circuit paths for the circuit shown in FIG. 5. Each clock has an arrival time window 1310. Clock 1 arrives between the clock 1 earliest arrival time 1302 and the clock 1 latest arrival time 1304. Likewise, clock 2 arrives between the clock 2 earliest arrival time 1306 and the clock 2 latest arrival time 1308. The arrival time window 1310 of clock 2 is larger than that of clock 1, because of the propagation delay uncertainty of the logic 502 that the clock 2 signal passes through. The logic 502 further imposes a relational constraint between the arrival time of clock 1, compared to the arrival time of clock 2 that makes only a subset of the permutations of the absolute arrival times valid. For example, clock 2 can have an earliest arrival time 1306 if and only if clock 1 had an arrival time at the earliest point 1302. Likewise, clock 2 can have a latest arrival time 1308 if and only if clock 1 had an arrival time at the latest point 1304.

A clock tree contains the circuit paths that describe the connectivity of the clock signals that synchronize data flow within the circuit. Phase shift (602) is generally caused by physical interconnect and component delays being considered as part of the circuit analysis. Skew can desirably be defined as the accumulated uncertainty in the phase shift. Phase shift and skew combine to describe the entire delay range experienced by the clock signal in the circuit.

Figure 14:
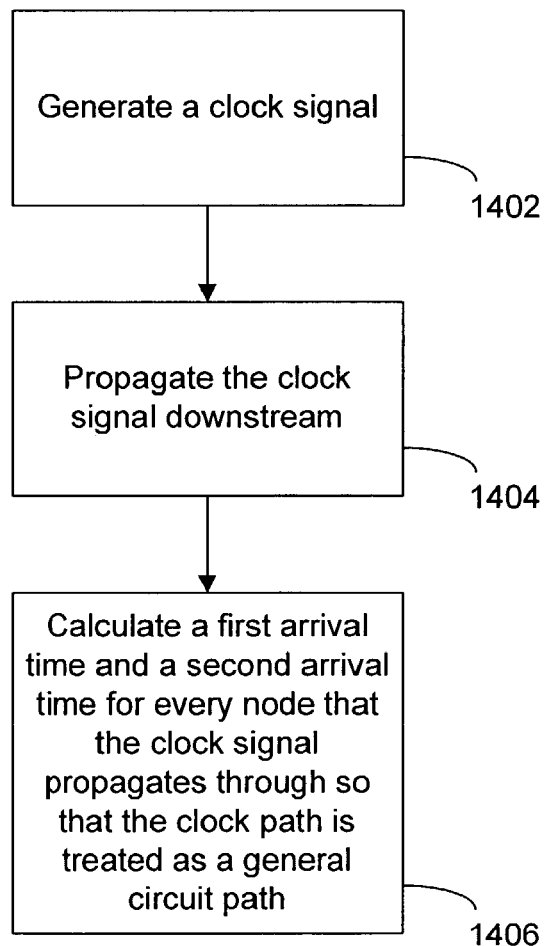
FIG. 14 is a flow chart of an embodiment of a method for treating clock paths as general circuit paths.

FIG. 14 shows a flow chart of a method of treating clock paths as general circuit paths. At 1402 a clock signal is generated. At 1404 the clock signal is propagated downstream. At 1406 a first arrival time and a second arrival time are desirably calculated for every node that the clock signal propagates through so that the clock path is treated as a general circuit path. The first arrival time and second arrival time comprise an arrival time window for the clock signal at the given node. The described dynamic analysis tool overcomes drawbacks that the prior art has with clock signals by treating clock signals as general circuit paths.

In addition to desirably treating clock paths as general circuit paths, one embodiment of a dynamic timing analysis tool identifies and stores causality links in the event database 814.

Figure 15:
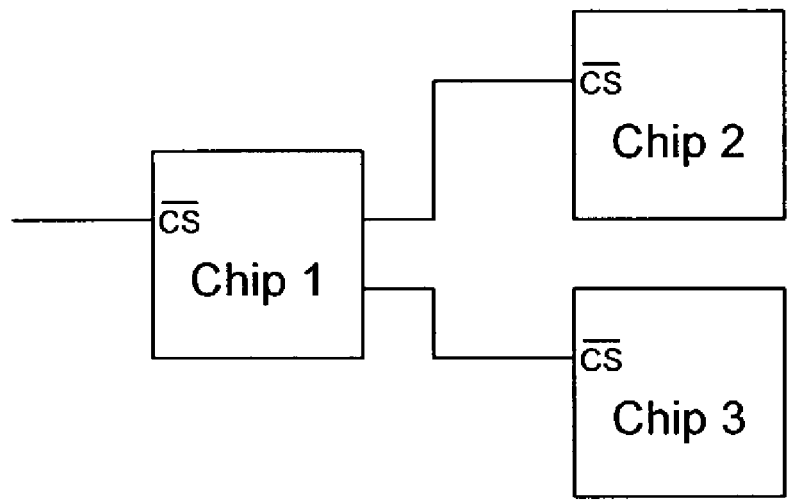
FIG. 15 shows an example circuit to illustrate one example of causality links.

FIG. 15 shows an example circuit with three chips that have traces hooked up to the chip select (CS) pin, which is asserted low, of each chip. In this example, when the CS pin of chip 1 is asserted, chip 1 changes state from idle to active and asserts the CS lines leading to chips 2 and 3 in order to bring chips 2 and 3 out of an idle state. There is at least one causality link for the state change event for each of chips 2 and 3, because one or more events must have triggered the state change in each of chips 2 and 3.

Figure 16:
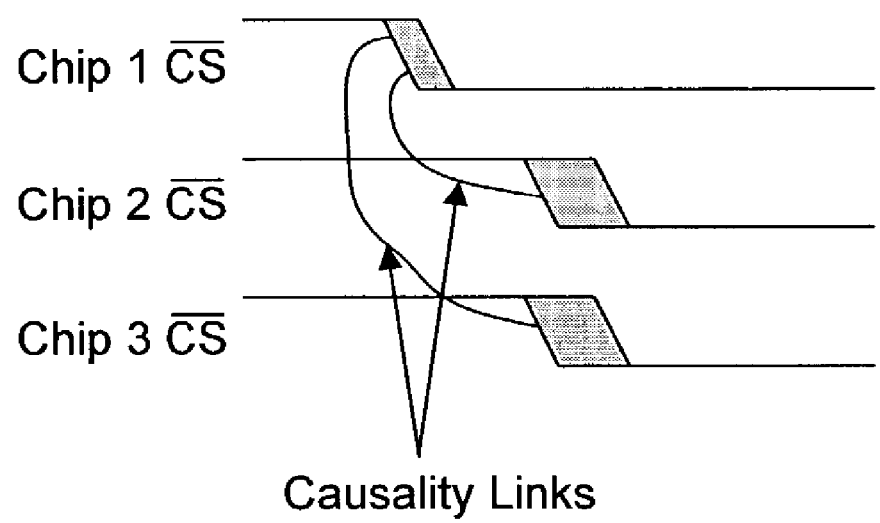
FIG. 16 shows the causality links for the circuit of FIG. 15.

FIG. 16 shows the causality links between the chip 1 CS line and the CS lines of chips 2 and 3. The arrival time windows for the CS line on chips 2 and 3 are wider than that of chip 1 CS, because of the propagation delay uncertainty through chip 1. Thus, an event at chip 1 causes events at both chip 2 and chip 3.

Events, as discussed above, are desirably stored with causality links in the event database 814. An event in the event database is desirably stored as a data structure with various fields.

Figure 17:
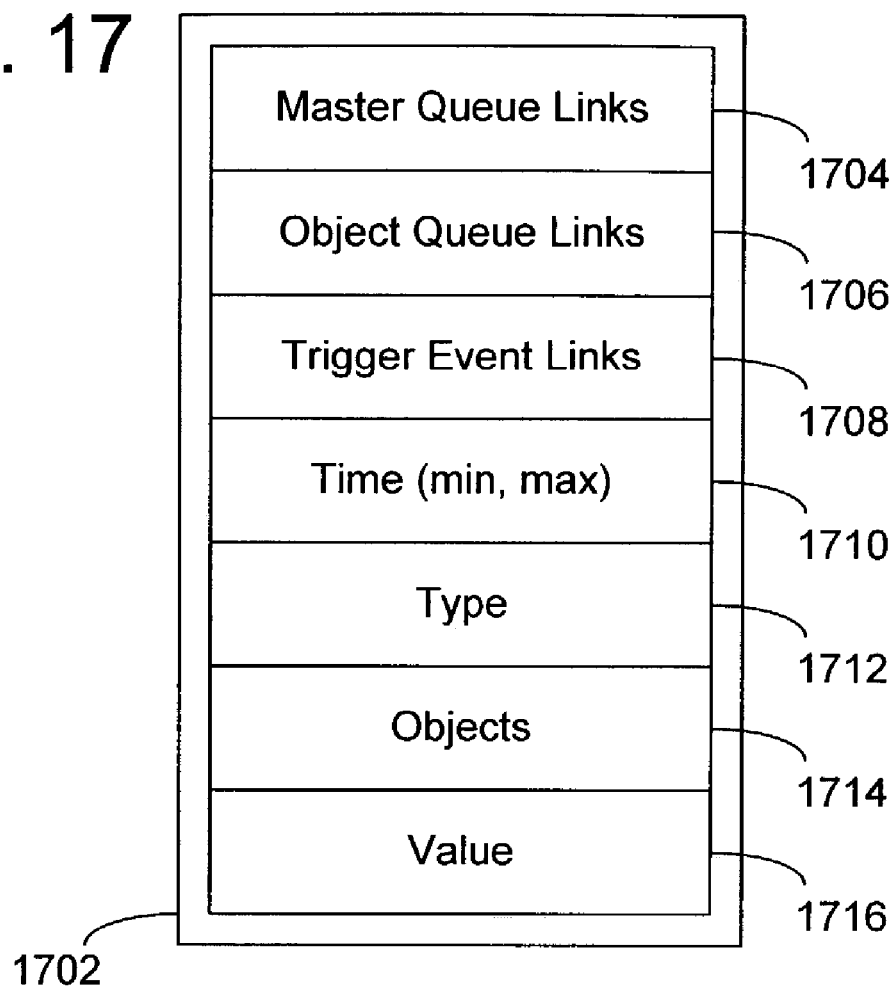
FIG. 17 shows an exemplary event data structure which may be used by the dynamic timing analysis tool of FIG. 8.

FIG. 17 shows an exemplary event data structure 1702. The event data structure 1702 desirably contains all of the data necessary to track an event. Master queue links 1704 can form a doubly linked list of a master event queue. The master event queue can desirably be a list of all events in the simulation arranged in chronological order. Object queue links 1706 can form a doubly linked list of an object queue for each bus functional description, captured, in this example, in the form of a FSM. An object queue can desirably be a list of events for a discrete component and desirably allows a designer to easily examine all events for the component. Trigger event links 1708 can be pointers to the preceding event or events that trigger the current event. The Time range 1710 desirably refers to the time window in which the event can be triggered. The Type field 1712 desirably identifies the nature of the event, which, for example, can include:

StateTransition: The FSM is changing from one state to another (the "next" state can, in fact, be the same state). This is generally the result of an input port changing value.

StateToPort: The value on a FSM output port changes value, has a result of a FSM state transition.

PortToNet: The change in value on a FSM output port is applied to the attached signal net.

NetResolution: The value of a particular net is computed (as a result of one or more changing output port by use, or a forcing stimulus).

NetToPort: A changing value of a signal net results in a value change on the attached FSM input ports.

Force: A direct forcing stimulus is applied to a signal net or FSM input port.

Other event natures can also be included.

The Objects field 1714 in the FIG. 17 example can comprise links to simulation objects, such as FSM state transitions, FSM ports, and signal nets, affected by the event. For example, a NetToPort event can contain links to both the signal net and the affected FSM input port.

The Value field 1716 desirably specifies a new logic value associated with the event. The Value field 1716 desirably comprises both the logic state (high, low, unknown, valid, or invalid) and the driving strength of the value (high impedance, resistive, strong, unknown, or forced). Some events, such as StateTransition events, do not have values, because the "value" is the transition itself. Each event is desirably added to the master event queue as it is created.

Figure 18:
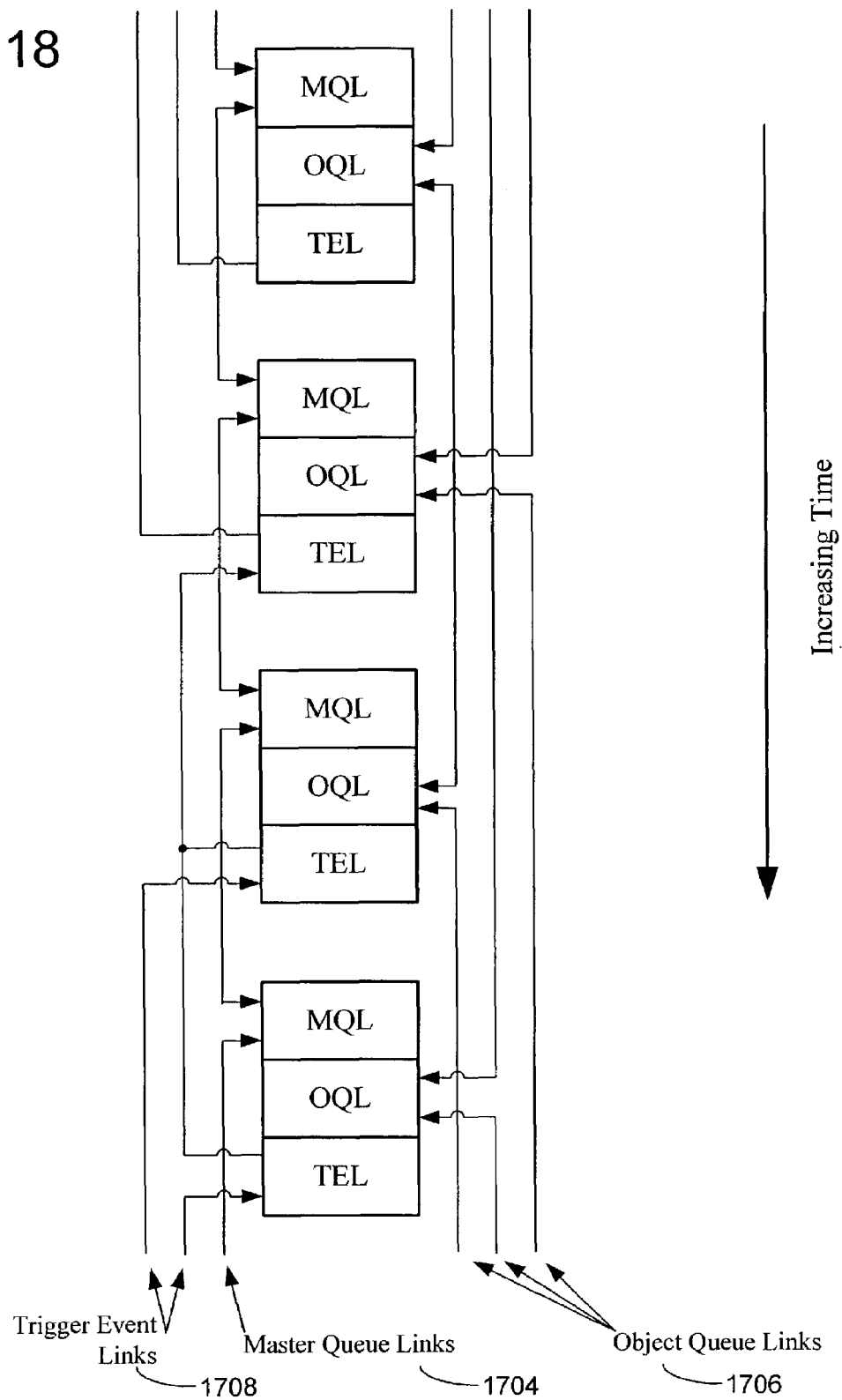
FIG. 18 shows a portion of an exemplary event database with causality links.

FIG. 18 shows an example of section of a master event queue. The event database 814 with causality links comprises a multiply linked list of event data structures, also known as the master event queue. The events in this example are desirably arranged in the master event queue in chronological order. Master queue links 1704 in this example point to events immediately before and after a given event. Object queue links 1706 in this example point to events before and after a given event that affect the same discrete component. Trigger event links 1708 in this example point to one or more proceeding events that trigger a given event. It should be apparent that the event database 814 with causality links desirably comprises the master event queue with the master, object, and trigger event links.

The described exemplary dynamic timing analysis tool can also be used across a network with a client and server. If a network is not available, data may be transferred between the client and server via a computer readable media. The client/server model allows the bulk of the processor and/or memory intensive work to be offloaded onto a machine with better resources.

Figure 19:
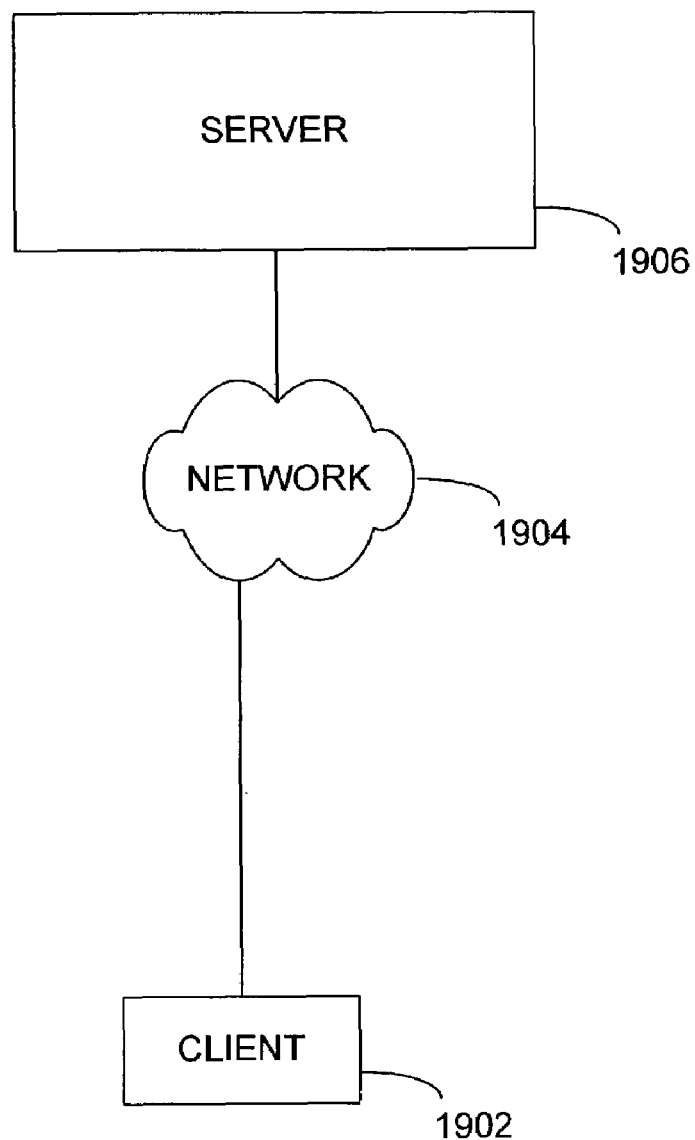
FIG. 19 shows a client computer and server connected over a network.

FIG. 19 shows a client/server arrangement with a network. The client 1902 and server 1906 communicate with each other across a network 1904.

FIG. 20 shows an example of a client/server transaction across a network 1904. The client 1902 sends a symbolic model 2002, by way of an electronic file, for example, of a circuit design over the network 1904 to the server 1906. The server 1906 loads the symbolic model 2004, performs a range based simulation of the circuit design to create an event database with causality links 2006, analyzes the event database with causality links to detect potential timing violations 2008, and sends an electronic file comprising the timing analysis 2010 over the network 1904 to the client 1902. The client then receives the timing analysis 2012. The circuit design can be modified and these acts can be repeated to perform timing analysis of the modified circuit design.

It should be apparent to those skilled in the art that the example shown in FIG. 20 is not the only way to divide the dynamic timing analysis process between a client 1902 and server 1906. The client 1902 could instead send an electronic file of the circuit design and have the server 1906 create the symbolic model, or the client 1902 could simulate the circuit design and send an electronic file of the event database 814 with causality links to be analyzed by the server 1906. All divisions of the dynamic timing analysis process using a client/server model are part of the described dynamic timing analysis tool.

It should be apparent to those skilled in the art that ASIC timing analysis is very similar to circuit board timing analysis. Many ASIC designs comprise functional blocks that are hooked together in the same manner that integrated circuits on a circuit board are hooked together. As long as the functional blocks can be symbolically modeled, the dynamic timing analysis tool can perform bus functional timing analysis on the ASIC design. It should be noted that all references in the claims regarding timing analysis of a circuit design include timing analysis of an ASIC design. Similarly, a group of transistors may be arranged such that their bus functional behavior can be symbolically modeled and a bus functional timing analysis on the group of transistors may be performed. It should be noted that references in the claims regarding timing analysis of a circuit design encompass timing analysis of a circuit comprising a group of transistors.

Particular embodiments of a dynamic timing analysis tool have been described herein. Many alternative embodiments will now become apparent to those skilled in the art. It should be recognized that the described embodiments are illustrative only and should not be taken as limiting in scope. Rather, the present invention encompasses all such embodiments as may come within the scope and spirit of the following claims and equivalents thereto.

We claim:

1. A computer implemented method of analyzing timing of a circuit design comprising:
    performing a range based simulation of a circuit design, wherein performing the range based simulation comprises creating an event database comprising a list of one or more preceding events that trigger a current event; and
    analyzing the database to determine if there is at least one timing violation in the circuit simulation.

2. The method of claim 1, wherein the simulation runs for a plurality of clock cycles prior to the analysis.

3. The method of claim 1, wherein performing the range based simulation comprises storing an arrival time window for a signal that triggers an event.

4. The method of claim 1, wherein analyzing the database comprises calculating a range of slack times for a signal that triggers an event.

5. The method of claim 1, further comprising symbolically modeling the circuit design.

6. The method of claim 1, further comprising using results of analyzing the database as input into a circuit router.

7. The method of claim 1, further comprising modeling interconnect delays of a physical layout of the circuit design.

8. The method of claim 1, wherein performing the range based simulation comprises constructing a trigger event queue.

9. The method of claim 1, wherein performing the range based simulation comprises constructing a master event queue.

10. The method of claim 1, wherein performing the range based simulation and analyzing the database is performed by a combination of at least one client and at least one server.

11. The method of claim 10, wherein performing the range based simulation is performed by the at least one server.

12. The method of claim 10, wherein analyzing the database is performed by the at least one server.

13. The method of claim 10, further comprising transferring an electronic file corresponding to the circuit design from the at least one client to the at least one server.

14. The method of claim 13, wherein a network is used to transfer the electronic file.

15. The method of claim 13, wherein a computer readable media is used to transfer the electronic file.

16. The method of claim 10, further comprising transferring an electronic file corresponding to the simulated and analyzed circuit design from the at least one server to the at least one client.

17. The method of claim 16, wherein a network is used to transfer the electronic file.

18. The method of claim 16, wherein a computer readable media is used to transfer the electronic file.

19. A computer implemented method of analyzing timing of a circuit design comprising:
    generating a clock signal;
    propagating the clock signal downstream;
    calculating a first arrival time and a second arrival time for each node that the clock signal propagates through in the circuit design; and
    analyzing the first and second arrival times for each node to verify timing requirements of the clock signal.

20. The method of claim 19, wherein the first arrival time comprises an earliest arrival time and the second arrival time comprises a latest arrival time.

21. A computer implemented method of analyzing timing of a circuit design comprising:
    calculating a first arrival time and a second arrival time for a first signal in the circuit design;
    calculating a first arrival time and a second arrival time for a second signal in the circuit design;
    using the first arrival time of the first signal and the second arrival time of the second signal as a first set of signals to be tested for timing violations; and
    using the second arrival time of the first signal and the first arrival time of the second signal as a second set of signals to be tested for timing violations.

22. The method of claim 21, further comprising analyzing simulated behavior of a finite state machine using both the first set of signals and the second set of signals to identify possible timing violations.

23. A computer readable media containing a computer program for performing the method of claim 21.

24. An analysis tool for analyzing timing of a circuit design comprising:
    means for performing a range based simulation of a circuit design, wherein performing the range based simulation comprises creating an event database comprising a list of one or more preceding events that trigger a current event; and
    means for analyzing the database to determine if there is at least one timing violation in the circuit simulation.

25. A computer for analyzing timing of a circuit design comprising:
    at least one processor;
    memory;
    software for circuit timing analysis, wherein the software performs a range based simulation of a circuit design, wherein performing the simulation comprises creating a database comprising master queue links, object queue links, and trigger event links; wherein the software analyzes the database to determine if there is at least one timing violation in the circuit simulation.

26. The computer of claim 25, wherein the software treats clock paths as general circuit paths.

27. The computer of claim 25, wherein the software:
    calculates a first arrival time and a second arrival time for a first signal;
    calculates a first arrival time and a second arrival time for a second signal;
    uses the first arrival time of the first signal and the second arrival time of the second signal as a first set of signals to be tested for timing violations; and
    uses the second arrival time of the first signal and the first arrival time of the second signal as a second set of signals to be tested for timing violations.

28. The computer of claim 25, wherein the software symbolically models the circuit design.

29. The computer of claim 25, wherein the software further comprises a circuit router, wherein the software uses results of the analysis as input into the circuit router.

30. The computer of claim 25, wherein the software models interconnect delays of a physical layout of the circuit design.

31. A computer implemented method of analyzing timing of a circuit design comprising:

symbolically modeling the circuit design;

performing a first range based simulation of the circuit design, wherein performing the first simulation comprises creating a first event database comprising a first list of one or more preceding events that trigger a current event;

performing a first analysis on the first database to determine if there is at least one timing violation in the first simulation and providing results of the first analysis;

using results of the first analysis as input into a circuit router;

creating a physical layout of the circuit design with the circuit router; analyzing physical effects of interconnects of the physical layout;

modeling interconnect delays of the physical layout;

performing a second range based simulation of the circuit design with interconnect delays, wherein performing the second simulation comprises creating a second event database comprising a second list of one or more preceding events that trigger a current event;

performing a second analysis on the second database to determine if there is at least one timing violation in the second circuit simulation.

\* \* \* \* \*

UNITED STATES PATENT AND TRADEMARK OFFICE
CERTIFICATE OF CORRECTION

| | | |
|---|---|---|
| PATENT NO. | : 7,239,996 B2 | Page 1 of 1 |
| APPLICATION NO. | : 10/447762 | |
| DATED | : July 3, 2007 | |
| INVENTOR(S) | : Arthur J. Boland, Richard M. Pier and William Matthew Hogan | |

It is certified that error appears in the above-identified patent and that said Letters Patent is hereby corrected as shown below:

Column 4, line 15, "un-obvious" should be --unobvious--.

Column 14, line 50, "event links;" should be --event links,--.

Signed and Sealed this

Twenty-seventh Day of May, 2008

JON W. DUDAS
*Director of the United States Patent and Trademark Office*